(12) United States Patent
Lam et al.

(10) Patent No.: US 9,455,722 B2
(45) Date of Patent: Sep. 27, 2016

(54) METHOD AND APPARATUS FOR FAST LOCKING OF A CLOCK GENERATING CIRCUIT

(75) Inventors: Shirley Lam, Scarborough (CA); Nancy Chan, Richmond Hill (CA); Mikhail Rodionov, Markham (CA); Ramesh Senthinathan, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 209 days.

(21) Appl. No.: 11/164,622

(22) Filed: Nov. 30, 2005

(65) Prior Publication Data

US 2007/0120583 A1   May 31, 2007

(51) Int. Cl.
| | |
|---|---|
| H03L 7/06 | (2006.01) |
| H03L 7/08 | (2006.01) |
| H03L 7/089 | (2006.01) |
| H03L 7/10 | (2006.01) |

(52) U.S. Cl.
CPC ........... *H03L 7/0802* (2013.01); *H03L 7/0891* (2013.01); *H03L 7/10* (2013.01)

(58) Field of Classification Search
USPC ............. 327/147–151, 156–163; 331/17, 25; 375/373–376
See application file for complete search history.

(56) References Cited

U.S. PATENT DOCUMENTS

| | | | | |
|---|---|---|---|---|
| 4,998,163 A * | 3/1991 | Salvati | ........................... | 348/270 |
| 5,128,633 A * | 7/1992 | Martin et al. | ..................... | 331/2 |
| 5,379,002 A * | 1/1995 | Jokura | ............................ | 331/10 |
| 5,446,411 A * | 8/1995 | Horsfall et al. | ............... | 329/325 |
| 5,977,836 A | 11/1999 | Swan et al. | | |
| 6,194,971 B1 | 2/2001 | Glen et al. | | |
| 7,023,248 B2 * | 4/2006 | Ott | ................................. | 327/143 |
| 7,023,284 B2 * | 4/2006 | Sogawa et al. | ................. | 331/10 |
| 2004/0239404 A1 * | 12/2004 | Behzad | ......................... | 327/512 |

OTHER PUBLICATIONS http://cobweb.ecn.purdue.edu/~mcjohnso/Cadence/559TUT_2_ver5_fall06.pdf (no date).*
Ronny C. Chan et al., "Method and Apparatus for Generating Multiphase Clocks," U.S. Appl. No. 11/004,754, filed Dec. 3, 2004.

* cited by examiner

*Primary Examiner* — Lincoln Donovan
*Assistant Examiner* — Khareem E Almo
(74) *Attorney, Agent, or Firm* — Faegre Baker Daniels LLP

(57) ABSTRACT

In a method and apparatus for using a clock generating circuit to minimize settling time after dynamic power supply voltage ramping, a clock signal may be generated using a clock generating circuit having, among other things, open feedback loop switch logic and a dynamic fast lock control signal generator. Whereupon, when in operation, the open feedback loop switch logic is responsive to a controlled change in power supply voltage condition such that a feedback loop of the clock generating circuit is opened during power supply voltage ramping (e.g., during transitions to or from battery conservation modes). In response to opening the feedback loop, the dynamic fast lock control signal generator selectively applies a stabilizing control signal to a variable clock signal generator (e.g., a voltage controlled oscillator) such that the generated clock signal can quickly lock onto the proper target frequency.

30 Claims, 13 Drawing Sheets

LOOK-UP TABLE

| PROCESS CORNER | DESIRED POWER SUPPLY VOLTAGE (E.G., VDD2) | CONTROL SIGNAL (TO REGISTER DIVIDER NETWORK) |
|---|---|---|
| SLOW | VDD1+X% <br> VDD1-X% ... | $SP_{0,1}$ <br> $SN_{1,2}$ ... |
| NOMINAL | VDD1+X% <br> VDD1-X% ... | $SP_{2,1}$ <br> $SN_{2,2}$ ... |
| FAST | VDD1+X% <br> VDD1-X% ... | $SP_{3,1}$ <br> $SP_{3,2}$ ... |

METHOD AND APPARATUS FOR FAST LOCKING OF A CLOCK GENERATING CIRCUIT

FIELD OF THE INVENTION

The invention generally relates to clock generating circuits and, more particularly to clock generating circuits that minimize clock settling time.

BACKGROUND OF THE INVENTION

Wireless, handheld and other battery-powered mobile devices seem ubiquitous in the modern world. Much of the market success enjoyed by these electronic devices is attributable to, among other things, each device's functionality and degree of mobility. While battery-powered devices allow mobile users to operate in all environments and geographical locations, such products are prone to periodic recharging and replacement. In other words, batteries are capable of providing only limited operation time and suffer from a short lifespan. Therefore, systems that extend battery life in mobile devices are demanded by consumers.

As a result of this demand, many mobile devices and other computer systems utilize controlled power supply voltage ramping to dynamically change the power supply voltage of the device according to its operational mode. For instance, as a device enters a low power mode (e.g., stand-by mode), the power supply voltage can be dynamically lowered or ramped down to conserve battery life. Additionally, as a device wakes up from a low power mode and desires normal operation of a device or higher performance, the power supply voltage of the system can be increased, or ramped up, to meet this need. Thus, system efficiency is maximized and battery life is extended to satisfy today's highly mobile consumers.

FIG. 1 illustrates a prior art clock generating circuit 100 having a phase lock loop ("PLL") capable of adapting to dynamic power supply voltage ramps. As illustrated, the PLL of the clock generating circuit 100 might include a phase frequency detector 102 which receives a reference clock signal 104 and a feedback clock signal 106 and generates a phase adjust signal 118. Traditionally, the reference clock signal 104 is the system clock signal generated from a crystal oscillator (not shown). However, the reference clock signal 104 may be any desired periodic clock signal. A charge pump 108 receives the phase adjust signal 118 and is coupled to both a loop filter 110 and a variable clock signal generator 112. Conventionally, the charge pump 108, generates a charged control signal 122 (i.e., a pumped up or down current) that is passed through a loop filter 110 (or low pass filter). In turn, the loop filter 110 generates a phase compensated control signal 124 (e.g., a DC voltage) that is received by the variable clock signal generator 112. While the variable clock signal generator 112 may include a voltage controlled oscillator, it may also include any oscillator operative to produce a periodic clock signal with a frequency based on one or more characteristics of its input signal. The output of the variable clock signal generator 112 is a generated clock signal 114.

As appreciated by those with ordinary skill in the art, the clock generating circuit 100 uses feedback so that the generated clock signal 114 can "lock onto" a desired frequency based on the frequency of a reference clock signal 104. In FIG. 1, feedback loop L accepts the generated clock signal 114 and generates a feedback clock signal 106 based on the generated clock signal 114. As illustrated, a divider 116 may be employed in the feedback loop L to tune the frequency of the feedback clock signal 106. In some prior art systems, the divider 116 serves to make the frequency of the feedback clock signal 106 a rational or fractional multiple of the frequency of the reference clock signal 104.

During normal operation, the PLL serves to automatically increase or decrease the frequency of the generated clock signal 114 until it matches the frequency of the reference clock signal 104. As the variable clock signal generator 112 generates the generated clock signal 114, the phase frequency detector 102 accepts the feedback clock signal 106, compares the frequency of the feedback clock signal 106 to that of the reference clock signal 104 and causes the charge pump 108 to speed up or slow down the variable clock signal generator 112. For instance, in one embodiment, if the frequency of the generated clock signal 114 falls behind that of the reference clock signal 104, the phase frequency detector 102 will output at least one phase adjust signal 118 causing the charge pump 108 and loop filter 110 to increase the voltage in the phase compensated control signal 124 thereby speeding up the variable clock signal generator 112. Similarly, if the frequency of the generated clock signal 114 creeps ahead of the frequency of the reference clock signal 108, the phase frequency detector 102 will output at least one phase adjust signal 118 causing the charge pump 108 and loop filter 110 to reduce the voltage in the phase compensated control signal 124 thereby slowing down the variable clock signal generator 112.

As one of ordinary skill in the art may appreciate, the prior art clock generating circuit 100 of FIG. 1 can be utilized in prior art systems capable of adapting to dynamic changes in power supply voltage as the operational mode of the system transitions among various states. For instance, power supply voltage (VDD) ramping may occur during a transition from a low power state (e.g., stand-by mode) to a normal power state (e.g., any other normal operation mode), or vice-versa or through more than two states. Utilizing the above general description of the clock generating circuit 100 in connection with the timing diagram of FIG. 14, the performance of the prior art clock generating circuit 100 can be evaluated. The plot of POWER SUPPLY VOLTAGE is measured in volts and indicates the power supply voltage of the clock generating circuit over time. As illustrated for purposes of example, the power supply voltage is constant at VDD1 until it is dynamically ramped down to VDD2. While dynamic power supply voltage ramping can occur linearly as indicated in FIG. 14, it may also take the form of a step-function or may represent any desired change in power supply voltage. The plot shows a transition as the power supply voltage is dynamically ramped from a higher power supply voltage, VDD1, to a lower power supply voltage, VDD2. The plot of PRIOR ART VARIABLE CLOCK SIGNAL GENERATOR INPUT, illustrates the phase compensated control signal 124 in FIG. 1 over time. Lastly, the plot of PRIOR ART FREQUENCY OF GENERATED CLOCK SIGNAL illustrates the frequency of the generated clock signal 114 of FIG. 1 over time.

As indicated by the four labels provided under the time axis in FIG. 14, a dynamic power supply voltage ramping cycle operating with a clock generating circuit may include several modes such as, but not limited to, a clock generating circuit reset mode, a chip reset mode, normal operation mode, power supply voltage (VDD) ramping mode and a post-ramping (return to normal operation) mode. As known in the art, a clock generating circuit reset may be used to temporarily disable or initialize the specific PLL/clock generating circuit as desired. In comparison, a chip reset mode generally occurs upon boot up of the system and initializes the entire integrated circuit upon which the clock generating circuit is typically situated. During both reset modes, the phase frequency detector 108 and loop filter 110 are disabled (i.e., they do not produce an output) and the charge pump 108 opens the feedback loop L. Additionally, as indicated in FIG. 14, the input of the variable clock signal generator 112 has an initial voltage due to the charge stored in the loop filter 110. Therefore, the generated clock signal 114 has a constant frequency. However, as the clock generating circuit 100 is utilized in normal operation, the feedback loop L is closed and the phase frequency detector 102 and the loop filter 110 are enabled (i.e., they produce an output). Consequently, the clock generating circuit 100 requires time for the generated clock signal 114 to effectively "lock onto" the desired frequency of the reference clock signal 104.

When the system undergoes dynamic power supply voltage ramping, the power supply voltage transitions from a first voltage, VDD1, to a second voltage, VDD2, as indicated above. During this stage, FIG. 14 illustrates one example where the variable clock signal generator 112 input voltage exponentially increases over time. Consequently, the frequency of the generated clock signal 114 output from the variable clock signal generator may also exponentially increase in time. After the power supply voltage completes ramping, the generated clock signal 114, now operating at VDD2, must again "re-lock onto" the frequency of the reference clock signal 104. As indicated in the timing diagram, the frequency of the generated clock signal 114 may require a significant amount of time to stabilize.

In summary, the clock generating circuit 100 is compatible with systems employing dynamic power supply voltage ramping. It allows mobile devices to dynamically scale up or down the power supply voltage and conserve power consumption. However, the clock generating circuit 100 suffers from having a frequency-changing generated clock signal 114 during voltage ramping and requires a long resettling time. This phenomenon is attributable to a significant amount of phase error detected at the phase frequency detector 102 and seen at the input of the charge pump 108 during and immediately after power supply voltage ramping.

Therefore, a need exists for faster clock generating circuits such as those adapted for dynamic power supply voltage ramping.

BRIEF DESCRIPTION OF THE DRAWINGS

The invention will be more readily understood in view of the following description when accompanied by the below figures and wherein like reference numerals represent like elements:

FIG. 6 is a graphical representation of one embodiment of a look-up table as utilized in the dynamic fast lock control signal generator show in FIG. 5;

DETAILED DESCRIPTION OF A PREFERRED EMBODIMENT

Figure 1:
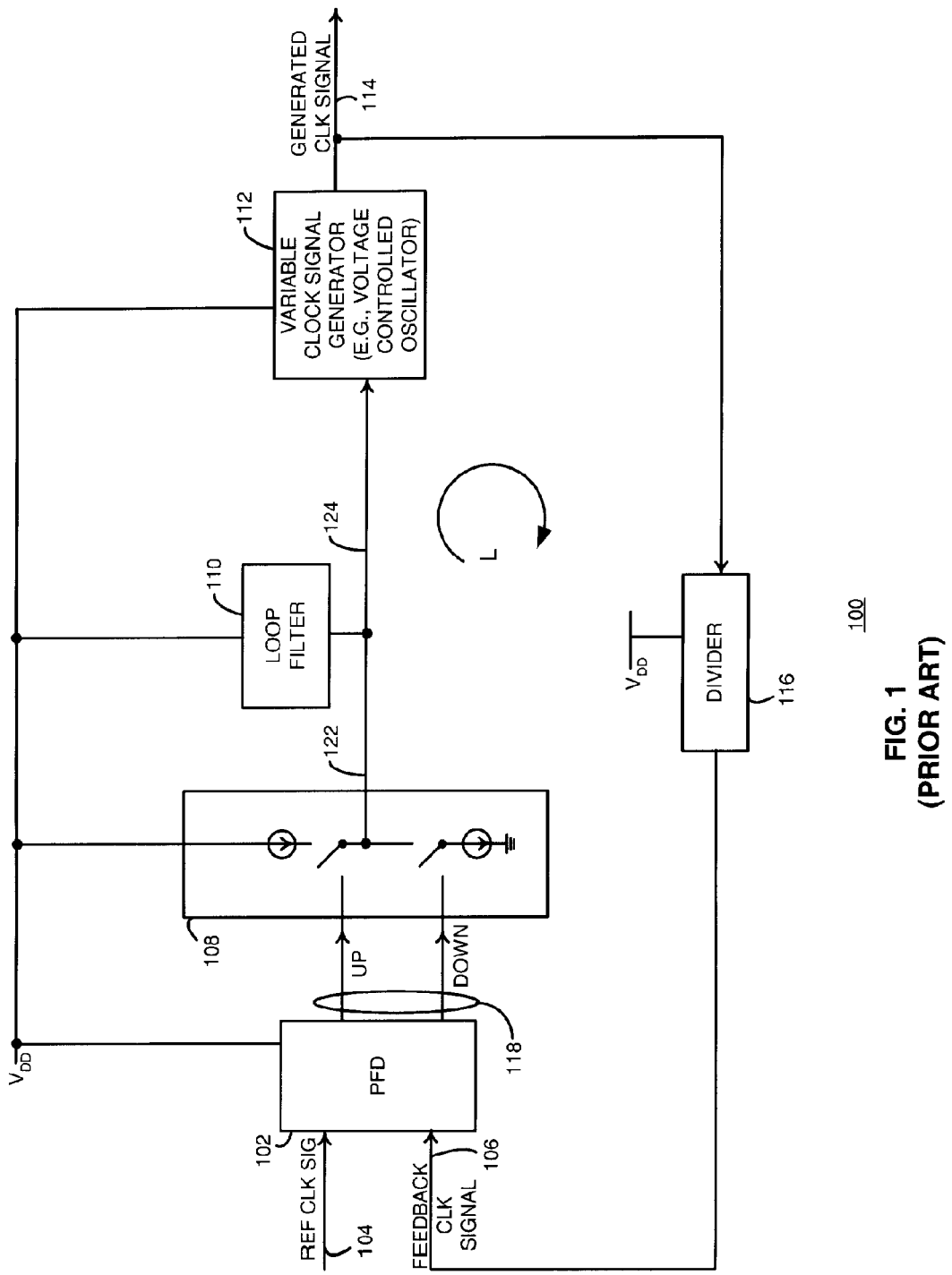
FIG. 1 is a block diagram illustrating one example of a clock generating circuit comprising a phase lock loop, as known in the art.

The present disclosure provides a method and apparatus for using a clock generating circuit in systems compatible with dynamic power supply voltage ramping such that the output of the clock generating circuit quickly locks on the proper frequency while operating at a new or ramped power supply voltage. In one embodiment an apparatus for generating a clock signal using a clock generating circuit includes, among other things, both open feedback loop switch logic and a dynamic fast lock control signal generator coupled to the input of a variable clock signal generator such as a voltage controlled oscillator. The open feedback loop switch logic is responsive to a controlled change in power supply voltage condition such that a feedback loop of the clock generating circuit is opened during power supply voltage ramping (e.g., during transitions to or from battery conservation modes).

In another embodiment, the clock generating circuit includes a selectively driven charge pump which includes open feedback loop switch logic that controls existing switch logic within the charge pump to selectively open and close the feedback loop of the clock generating circuit during power supply voltage ramping. In response to opening the feedback loop, the dynamic fast lock control signal generator selectively applies a stabilizing control signal to the variable clock signal generator such that the generated clock signal, (i.e. the output from the variable clock signal generator), can quickly lock onto the proper target frequency of the power supply voltage ramping.

In another embodiment, the dynamic fast lock control signal generator includes process corner and stabilizing logic that receives the generated clock signal during a chip reset mode and determines the process corner of the integrated circuit based upon a comparison between the frequency of the generated clock signal and at least one of a plurality of predetermined threshold frequencies. Based on the determined process corner and a received desired power supply voltage (i.e., the desired power supply voltage level after ramping), the process corner and stabilizing logic generates a control signal using a look-up table. A resistance divider network receives the control signal and selects which combination of pull up and/or pull down resisters to enable, thereby generating a stabilizing control signal. After power supply voltage ramping, the stabilizing control signal is selectively applied to the variable clock signal generator to minimize settling time of the generated clock signal.

In another embodiment, the generated clock signal received by the dynamic fast lock control signal generator during a chip reset mode is based on a process corner control signal. For instance, during a chip reset mode the variable clock signal generator receives a process corner control signal from a process corner control signal generator and produces the generated clock signal in response. The process corner control signal may correspond to the power supply voltage for the clock generating circuit during chip reset mode, but may also be any other suitable voltage or signal. After driving the variable clock signal generator with the process corner control signal and producing the generated clock signal, the dynamic fast lock control signal generator may determine the process corner of the integrated circuit based on the frequency of the generated clock signal as described above. The determined process corner can be utilized to classify the performance of the integrated circuit and the clock generating circuit and/or to generate a stabilizing control signal thereby minimizing settling time of the generated clock signal after power supply voltage ramping during normal mode.

By providing a stabilizing control signal to the variable clock signal generator after power supply voltage ramping, the frequency difference between the generated clock signal and the reference clock signal of the clock generating circuit is minimized and the settling time of the generated clock signal, as it locks onto the desired frequency at a second power supply voltage level, is decreased. As a consequence, devices capable of dynamic power supply voltage ramping can quickly change operational modes without unnecessary delay while also conserving battery life of a device.

Figure 2:
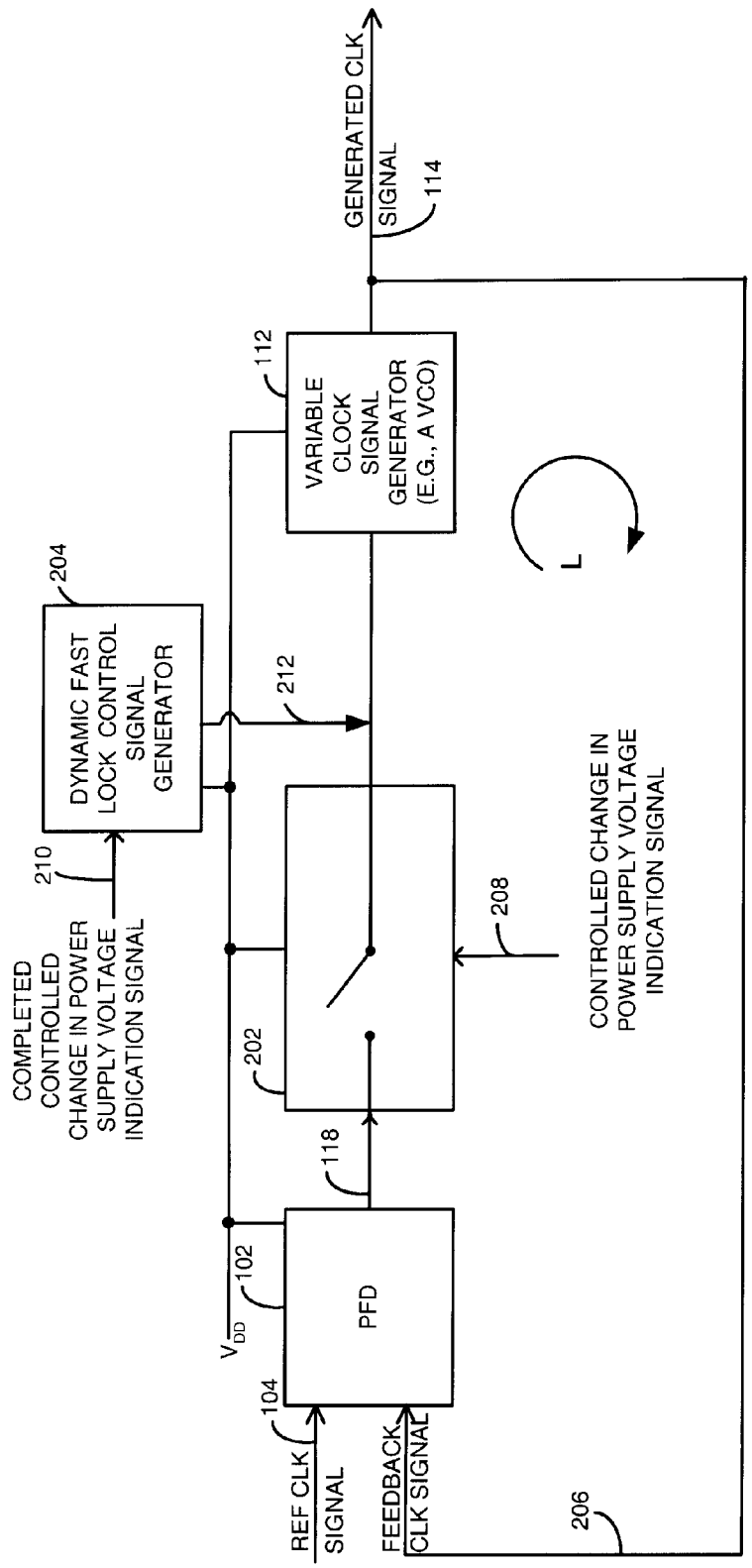
FIG. 2 is a block diagram illustrating one example of a clock generating circuit located on an integrated circuit with open feedback loop switch logic and a dynamic fast lock control signal generator in accordance with one embodiment of the invention.

Various embodiments of the present disclosure can be more fully described with reference to FIGS. 2 through 14. FIG. 2 is a block diagram illustrating one embodiment of a clock generating circuit 200 located on an integrated circuit. The clock generating circuit 200 includes, a phase frequency detector 102, open feedback loop switch logic 202, a dynamic fast lock control signal generator 204, a variable clock signal generator 112, and a feedback loop L.

As illustrated, the phase frequency detector 102 produces the phase adjust signal 118 based on a received reference clock signal 104 and feedback clock signal 206. The open feedback loop switch logic 202 is coupled to the phase frequency detector 102 such that the input of the open feedback loop switch logic 202 receives the phase adjust signal 118. In response to a controlled change in power supply voltage condition, such as an indication that a power supply voltage ramp condition will occur or is presently occurring, the open feedback loop switch logic 202 selectively and temporarily opens the feedback loop L in order to provide a quick lock of the PLL as further described below.

Figure 14:
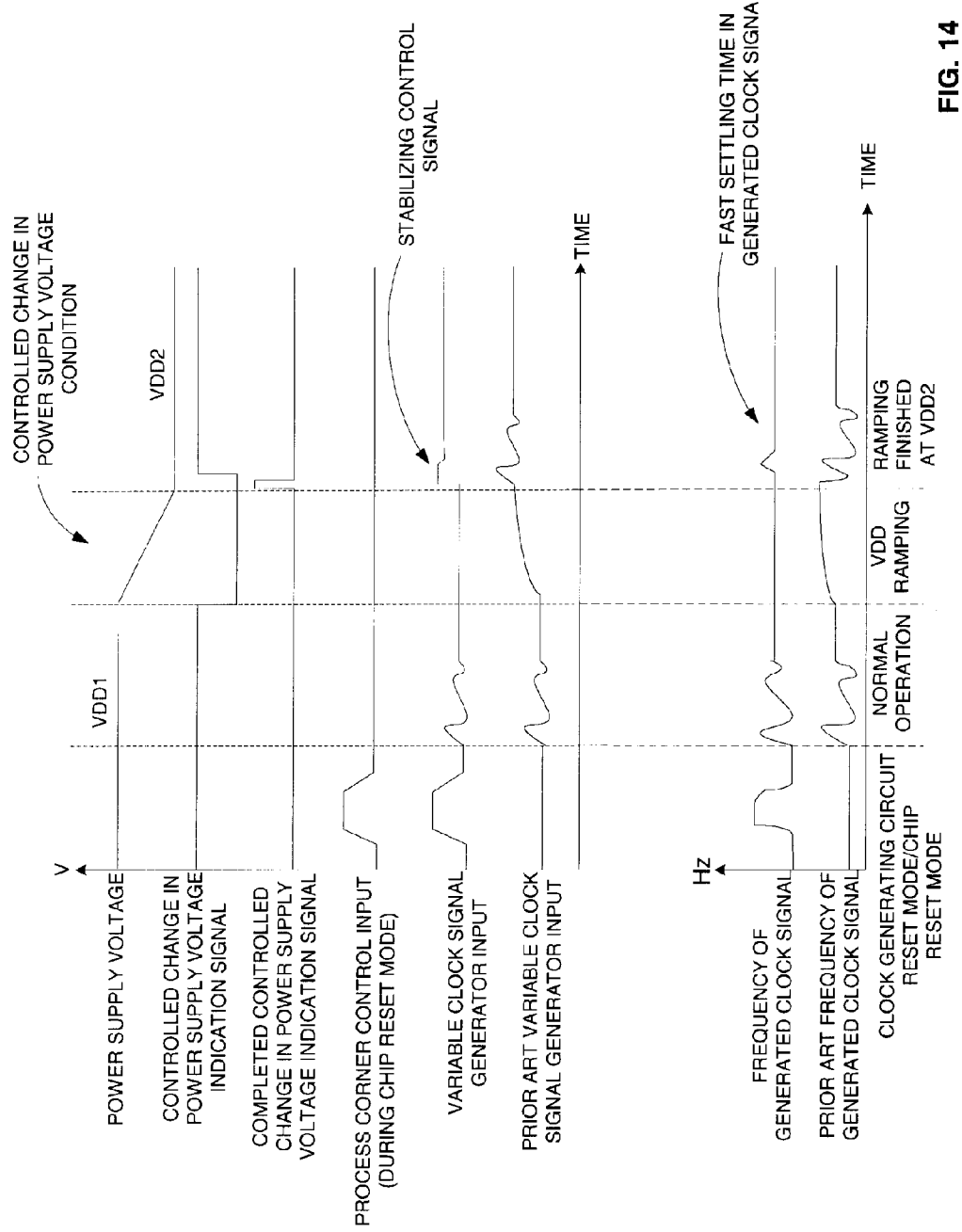
FIG. 14 is a timing diagram illustrating, by way of example, the temporal relationship between selected signals of the clock generating circuits of FIGS. 1, 2 and 4.

In one embodiment, the controlled change in power supply voltage condition may represent dynamic power supply voltage ramping. As explained above with respect to FIGS. 1 and 14, a controlled power supply voltage ramp may occur during a controlled power savings transition from one power state to another and may constitute, for example, a continuous, linear or stepped function of power supply voltage in time. However, one of ordinary skill in the art will recognize that a voltage ramp may be any change in power supply voltage. For purposes of illustration, FIG. 14 illustrates a plot of POWER SUPPLY VOLTAGE over time wherein a first power supply voltage, VDD1, is ramped down to a lower, second power supply voltage, VDD2, linearly over time. In this example, the chip, system or clock generating circuit may be entering a power save mode. Additionally, a power supply voltage ramp may constitute a ramping up from a first power supply voltage to a higher, second power supply voltage or vice-versa. Therefore, the controlled change in power supply voltage condition may represent an intentional change (as opposed to a change caused by noise etc.), a series of changes, or a desire to change from a first power supply voltage, VDD1, to a second power supply voltage, VDD2. Stated differently, the controlled change in power supply voltage condition may indicate that the chip, system, device or clock generating circuit 200 is about to enter a power supply voltage ramp or currently is undergoing a dynamic power supply voltage ramp.

In another embodiment, the open feedback loop switch logic 202 includes a control input that receives a controlled change in power supply voltage indication signal 208, which is indicative of a controlled change in power supply voltage condition. The open feedback loop switch logic 202 receives the controlled change in power supply voltage indication signal 208 and selectively opens the feedback loop L in response thereto. The controlled change in power supply voltage indication signal 208 may be any suitable indicator including but not limited to an analog or digital signal or any bit or series of bits capable of representing the controlled change in power supply voltage condition as described above. The plot labeled CONTROLLED CHANGE IN POWER SUPPLY VOLTAGE INDICATION SIGNAL in FIG. 14 provides an example of the controlled change in power supply voltage indication signal 208 over time. As illustrated, the controlled change in power supply voltage indication signal 208, in one embodiment, generally serves to indicate, among other things, both the start and end of a voltage ramp. Additionally, the controlled change in power supply voltage indication signal 208 may be generated by any suitable logic capable of, among other things, detecting a controlled change in power supply voltage condition. For example, as known in the art, a power management circuit may indicate that a power savings mode needs to be entered and a register bit may be set or other indication may be provided.

The dynamic fast lock control signal generator 204 of the clock generating circuit 200 has an output that selectively applies a stabilizing control signal 212 to the input of the variable clock signal generator 112. (See e.g., FIGS. 2 and 4; FIG. 14, plot labeled VARIABLE CLOCK SIGNAL GENERATOR INPUT). In one embodiment, the dynamic fast lock control signal generator 204 selectively and temporarily applies the stabilizing control signal 212 to the input of the variable clock signal generator 112 in response to the open feedback loop switch logic 202 selectively opening the feedback loop L. In another embodiment, the dynamic fast lock control signal generator 204 selectively applies the stabilizing control signal 212 to the input of the variable clock signal generator 112 in response to selectively opening the feedback loop L and in the absence of the controlled change in power supply voltage condition. The absence of the controlled change in power supply voltage condition may indicate, for example, that the power supply voltage is no longer being ramped (i.e., the power supply voltage has reached the desired power supply voltage, VDD2). In yet another embodiment, the dynamic fast lock control signal generator 204 is operative to receive a completed controlled change in power supply voltage indication signal 210 and selectively apply the stabilizing control signal 212 to the input of the variable clock signal generator 112 in response to the completed controlled change in power supply voltage indication signal 210.

The completed controlled change in power supply voltage indication signal 210 may be any indicator or analog or digital signal or any bit or series of bits capable of representing the absence of the controlled change in power supply voltage condition as discussed above. In other words, the completed controlled change in power supply voltage indication signal 210 may be any signal capable of indicating that the power supply voltage is no longer being ramped (e.g., any signal capable of representing the completion of a voltage ramping from a first power supply voltage level to a second power supply voltage level). One example is illustrated in FIG. 14 by the plot labeled COMPLETED CONTROLLED CHANGE IN POWER SUPPLY VOLTAGE INDICATION SIGNAL. The completed controlled change in power supply voltage indication signal 210 may be generated by any suitable logic capable of detecting the completion of power supply voltage ramping as described above. In another embodiment, the completed controlled change in power supply voltage indication signal 210 may be selectively accessed in any suitable register by the clock generating circuit 200 or provided in any suitable manner.

The variable clock signal generator 112 of the clock generating circuit 200, may include a voltage controlled oscillator (VCO). However, it will be recognized that the variable clock signal generator 112 may include any suitable structure capable of generating an output signal, the generated clock signal 114, with a frequency based in part on a received input signal. As further illustrated with FIG. 2, the generated clock signal 114 also serves as the basis for the feedback clock signal 206. Because the stabilizing control signal 212 is selectively applied to the input of the variable clock signal generator 112, the generated clock signal 114 is able to quickly settle and lock onto the desired frequency as illustrated in the plot labeled FREQUENCY OF THE GENERATED CLOCK SIGNAL in FIG. 14.

Figure 3:
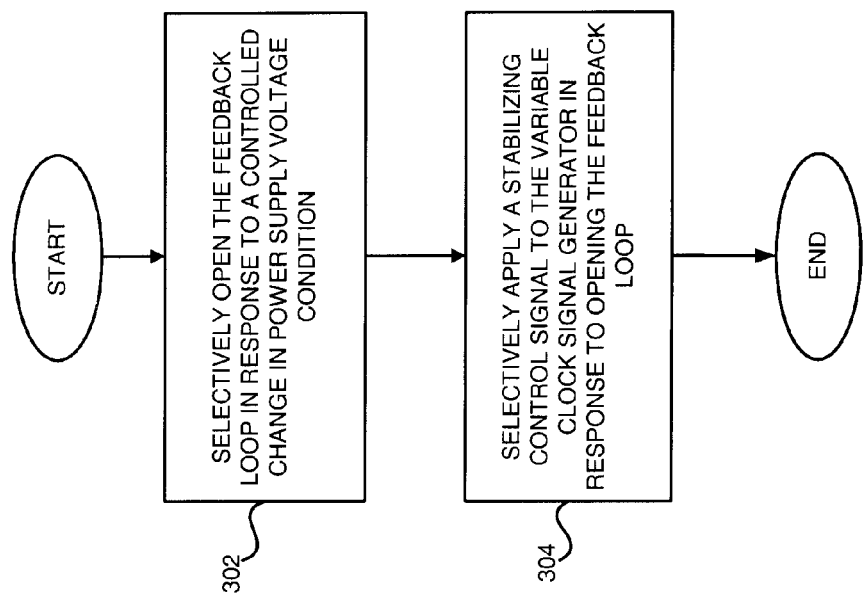
FIG. 3 is a flow chart illustrating one example of method for generating a clock signal using a clock generating circuit located on an integrated circuit having a feedback loop and a variable clock signal generator.

FIG. 3 is a flowchart illustrating an example of one method for generating a clock signal using a clock generating circuit located in an integrated circuit having a feedback loop and a variable clock signal generator. The method of FIG. 3 will be used to help describe the operation of the clock generating circuit 200 of FIG. 2. However, any reference to the structure of FIG. 2 is for purposes of illustration only and is not intended to limit the method described herein. The method begins with block 302 wherein the feedback loop is selectively opened in response to a controlled change in power supply voltage condition. As indicated above, this may be done, in one implementation, by the open feedback loop switch logic 202 of the clock generating circuit 200 selectively opening the feedback loop L in response to a controlled change in power supply voltage condition. The method continues, in block 304, wherein a stabilizing control signal is selectively applied to the variable clock signal generator in response to opening the feedback loop. For example, a temporary pulse is provided to the clock generating circuit after the feedback loop is opened. As mentioned above, this may correspond, in one embodiment, to a dynamic fast lock control signal generator 204 of the clock generating circuit 200 selectively applying a stabilizing control signal 212 to the variable clock signal generator 112 in response to, among other things, opening the feedback loop L. After selectively applying the stabilizing control signal as illustrated in block 304, the feedback loop is closed to allow the generated clock signal to lock and, the method ends.

Figure 4:
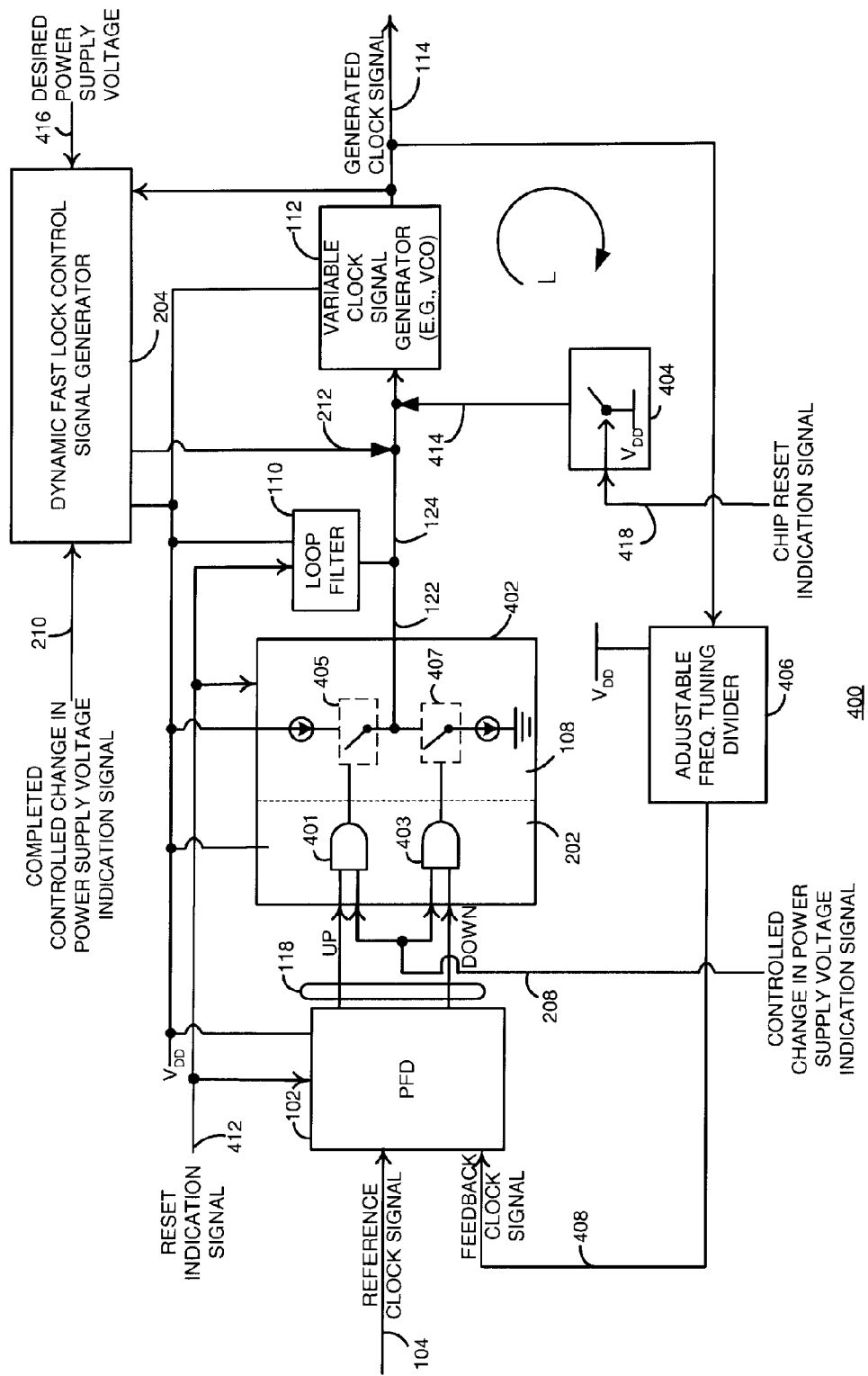
FIG. 4 is a more detailed block diagram illustrating a second example of a clock generating circuit located on an integrated circuit with a selectively driven charge pump and a dynamic fast lock control signal generator in accordance with another embodiment of the invention.

FIG. 4 is a detailed blocked diagram illustrating a second example of a clock generating circuit 400 located on an integrated circuit that includes, a phase frequency detector 102, a selectively driven charge pump 402, a loop filter 110, a process corner control signal generator 404, a dynamic fast lock signal control signal generator 204, a variable clock signal generator 112, and an adjustable frequency tuning divider 406. Similar to the clock generating circuit 200 illustrated in FIG. 2, the clock generating circuit 400 of FIG. 4 may be recognized as a modified PLL having the ability to adapt to dynamic power supply voltage ramp conditions.

As illustrated, the phase frequency detector 102 produces a phase adjust signal 118 based on a reference clock signal 104 and a feedback clock signal 408. As illustrated in FIG. 4, the phase adjust signal 118 may correspond to individual "up" and "down" phase adjust signals 118. Operatively coupled to the phase frequency detector 102 is a selectively driven charge pump 402, wherein the selectively driven charge pump 402 may include, in one example, open feedback loop switch logic 202 operatively coupled to a charge pump 108.

In one embodiment, the open feedback loop switch logic 202 includes two AND gates 401 and 403. AND gate 401 receives the individual "up" phase adjust signal 118 and the controlled change in power supply voltage indication signal 208. Similarly, AND gate 403 receives the individual "down" phase adjust signal 118 and the controlled change in power supply voltage indication signal 208. The output of each AND gate 401 and 403 may be coupled to existing switching structures present in the charge pump 108. For instance, charge pump 108 may contain switch 405 and switch 407, wherein switch 405 is switchably coupled to the output of AND gate 401 and the remaining structure of the charge pump 108, and wherein switch 407 is switchably coupled to the output of AND gate 403 and the remaining structure of the charge pump 108. In operation, the phase adjust signal 118 and controlled change in power supply voltage indication signal 208 control the charge pump 108 by either opening the feedback loop L or closing the feedback loop L using switch 405 and switch 407 thereby providing the charged control signal 122 to the loop filter 110. However, it is recognized that any suitable mechanism may be used to selectively control the charge pump 108 based on the phase adjust signal 118 and the controlled change in power supply voltage indication signal 208.

In addition, at least one of the loop filter 110, the selectively driven charge pump 402 (more specifically, the charge pump 108) and the phase frequency detector 102 may further include additional control inputs operative to receive a reset indication signal 412. In response to the reset indication signal 412, the selectively driven charge pump 402 selectively opens the feedback loop L during either a clock generating circuit reset mode or a chip reset mode. The phase frequency detector 102 and the loop filter 110, upon receipt of the reset indication signal 412, enter a dormant mode where no output is produced in either device. The reset indication signal 412 may be generated by any appropriate logic capable of detecting a clock generating circuit reset mode or a chip reset mode. Alternatively, the reset indication signal 412 may be stored in a register located on or off the clock generating circuit 400 capable of being accessed by at least one of the loop filter 110, the selectively driven charge pump 402 and the phase frequency detector 102. The reset indication signal 412 may be any suitable indicator including but not limited to an analog or digital signal, or any bit or series of bits.

The dynamic fast lock control signal generator 204 receives the generated clock signal 114, produces the stabilizing control signal 212 and selectively applies the stabilizing control signal 212 to the variable clock signal generator 404 in response to opening the feedback loop L. In one embodiment, the dynamic fast lock control signal generator 204 produces the stabilizing control signal 212 based in part on the generated clock signal 114. In another embodiment, the dynamic fast lock control signal generator 204 produces the stabilizing control signal 212 based in part on the generated clock signal 114 and a desired power supply voltage 416. The desired power supply voltage 416 value may be supplied by any suitable logic, or register located on or off the clock generating circuit 400 whereby the desired power supply voltage 416 represents a final or desired power supply voltage after dynamic power supply voltage ramping is complete (i.e., VDD2 in FIG. 14). As described above with respect to FIG. 2, the dynamic fast lock control signal generator 204 selectively applies the stabilizing control signal 212 based on the absence of the controlled change in power supply voltage condition or the completed controlled change in power supply voltage indication signal 210.

As illustrated, the generated clock signal 114 supplied to the dynamic fast lock control signal generator 204 is based on a process corner control signal 414 produced by a process corner control signal generator 404. The process corner control signal generator 404 may include, in one embodiment, a logic switch operative to selectively receive a chip reset indication signal 418, and operative to produce and apply a process corner control signal 414 to the input of the variable clock signal generator 112. Based on the chip reset indication signal 418, the process corner control signal generator 404 selectively closes the logic switch of the process corner control signal generator 404 thereby forcing or driving the process corner control signal 414 at the power supply voltage level (VDD) present in the clock generating circuit 400.

Similar to the reset indication signal 412, the chip reset indication signal 418 may be generated by any appropriate logic capable of detecting a system boot-up. Alternatively, the chip reset indication signal 418 may be stored in a register located on or off the clock generating circuit 400 capable of being accessed by the process corner control signal generator 404. The chip reset indication signal 418 may also be generated by the same logic or stored in the same register that generates or stores the reset indication signal 412. The chip reset indication signal 418 may be any suitable indicator including but not limited to an analog or digital signal, or any bit or series of bits. During system boot-up, the integrated circuit is initialized and the process corner of the integrated circuit can be determined in accordance with one embodiment described herein. Thereafter, a suitable stabilizing control signal level can be determined.

Lastly, the generated clock signal 114, provided by the variable clock signal generator 112, provides the basis for the feedback clock signal 408. As illustrated in FIG. 4, an adjustable frequency tuning divider 406 receives the generated clock signal 114 and produces the feedback clock signal 408 based upon the generated clock signal 114. During normal operation, the feedback clock signal 408 is compared to the reference clock signal 104 by the phase frequency detector 102 as described above.

Figure 5:
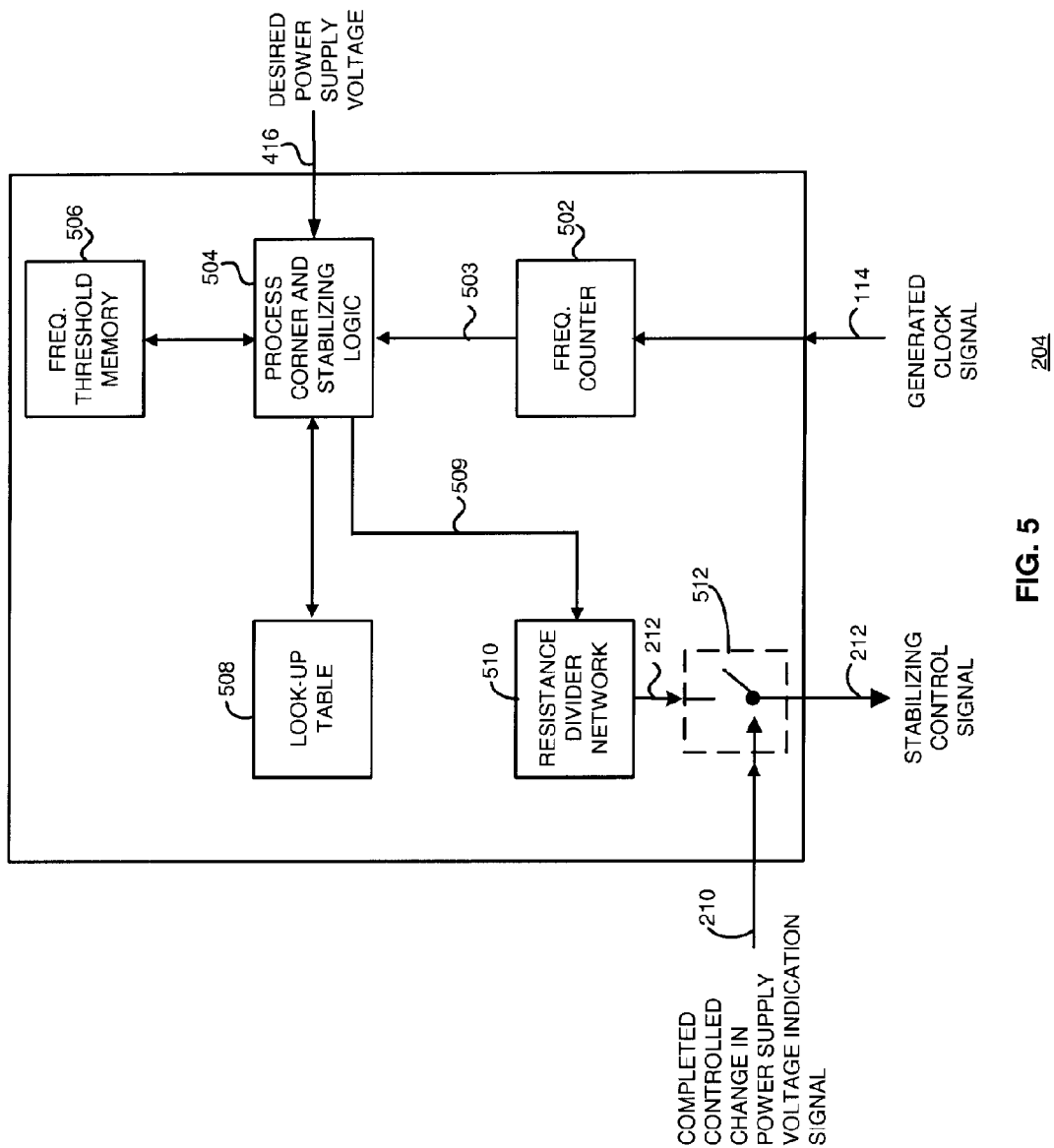
FIG. 5 is a block diagram illustrating, in more detail, the dynamic fast lock control signal generator shown in FIG. 4.

FIG. 5 is a block diagram illustrating, in more detail, one example of the dynamic fast lock control signal generator 204 shown in FIG. 4. As illustrated, the dynamic fast lock control signal generator 204, in one embodiment, may include a frequency counter 502, process corner and stabilizing logic 504, a frequency threshold memory 506, a look-up table 508, a resistance divider network 510, and a logic switch 512. The frequency counter 502 has an input operative to receive the generated clock signal 114 and an output operative to provide the determined frequency of the generated clock signal 503. As understood in the art, the frequency counter 502 may include any suitable combination of hardware and/or software capable of detecting the frequency of an input signal. In one embodiment, the frequency counter 502 is implemented as a software driver executed by any processor, such as a host processor.

The process corner and stabilizing logic 504 receives the determined frequency of the generated clock signal 503 in addition to the desired power supply voltage 416. Based on the determined frequency of the generated clock signal 503, the process corner and stabilizing logic 504 accesses the frequency threshold memory 506 and determines the process corner of the integrated circuit based on a comparison between the determined frequency of the generated clock signal 503 and a plurality of threshold frequencies stored in the frequency threshold memory 506. As understood in the art, the plurality of threshold frequencies are determined empirically from simulations. The process corner and stabilizing logic 504 subsequently accesses a look-up table 508 and determines a control signal 509 based on the desired power supply voltage 416 and the determined process corner of the integrated circuit. The control signal 509 is output to a resistance divider 510 which is operative to produce the stabilizing control signal 212 based on the control signal 509.

The frequency threshold memory 506 may include any suitable memory, or register located on or off the clock generating circuit 400 capable of storing, data representing at least one of a plurality of threshold frequency values and further capable of being accessed by the process corner and stabilizing logic 504. Similarly, the look-up table 508 may include any suitable memory or register located on or off the clock generating circuit capable off storing data representing various process corner classifications, various desired power supply voltage levels, and their corresponding control signals necessary to control a resistance divider network 510. FIG. 6 provides a graphical representation of a look-up table 508 as described above. Like the frequency threshold memory 506, the look-up table 508 must also be capable of being accessed by the process corner and stabilizing logic 504. In another embodiment, the frequency threshold memory 506 and the look-up table 508 may refer to different address locations within the same memory array.

Returning to FIG. 5, the process corner and stabilizing logic 504 may be implemented in any suitable manner including discrete logic, or any suitable combination of hardware and/or software. In one embodiment, the process corner and stabilizing logic 504 is implemented as a software driver executed by any processor such as a host processor. In another embodiment, the process corner and stabilizing logic includes separate process corner logic and separate stabilizing logic. In this manner the process corner logic is adapted to determine the process corner of the integrated circuit while the stabilizing logic is adapted to generate the control signal 509.

Figure 7:
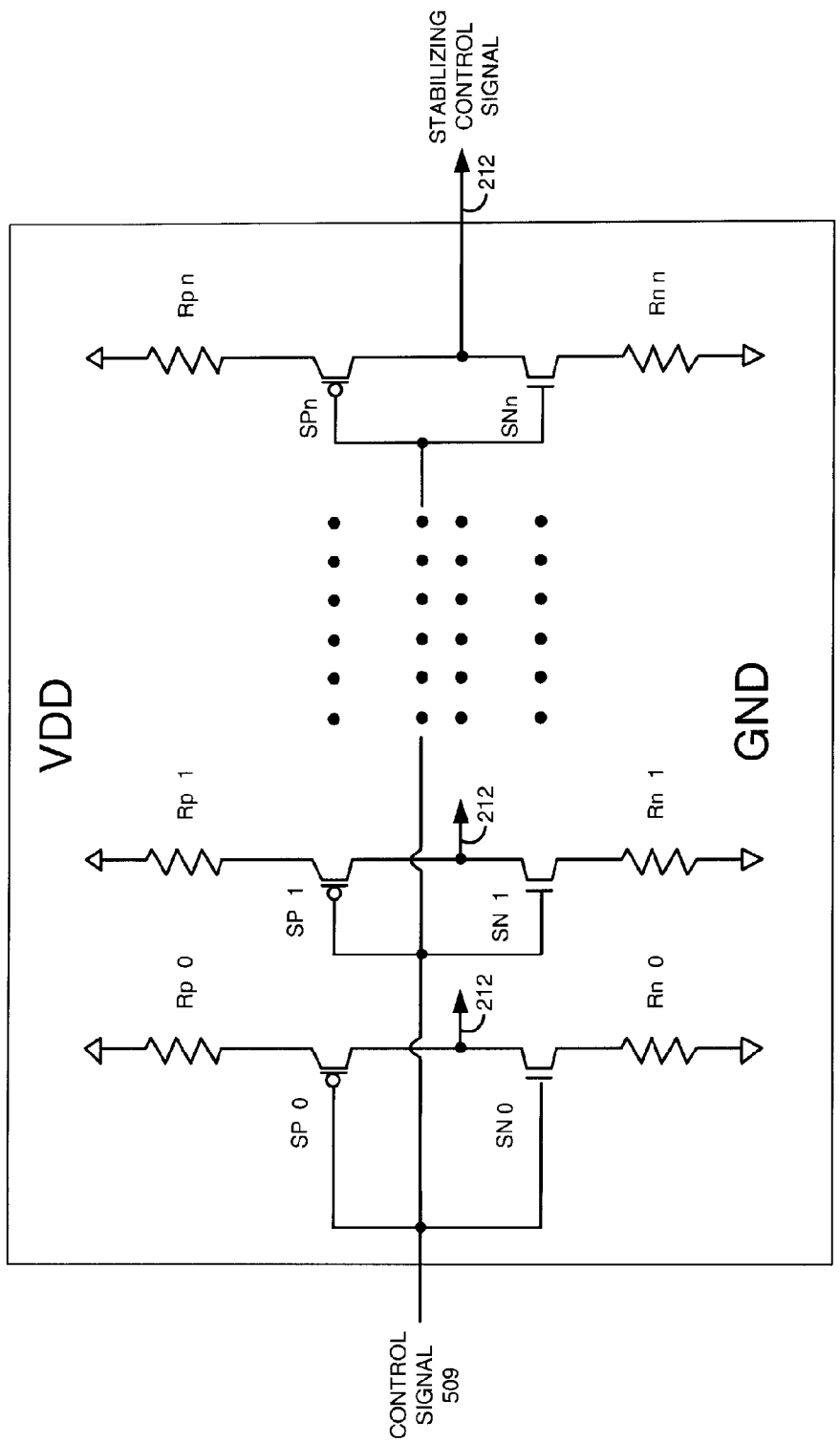
FIG. 7 is a circuit diagram of a resistance divider network as utilized in one embodiment of a dynamic fast lock control signal generator as shown in FIG. 5.

As illustrated in FIG. 7, one embodiment of a resistance divider network 510 includes a series of CMOS transistor switches coupled to pull up resisters such as Rp 0, Rp 1, Rp n, etc., and pull down resisters such as Rn 0, Rn 1, Rn n, etc. However, any other suitable switching mechanism may be utilized. In operation, the control signal 509 indicates which switches to turn on, thereby generating the desired stabilizing control signal 212. In this example, the stabilizing control signal 212 may represent a voltage such that the variable clock signal generator 112 produces the desired generated clock signal 114. While FIG. 7 illustrates the resistance divider network 510 in terms of a plurality of CMOS switches coupled to pull up and pull down resisters, one of ordinary skill in the art will recognize that any suitable switching mechanism or combination of hardware and/or software may be utilized to generate the desired stabilizing control signal 212.

The output of the resistance divider network 510, the stabilizing control signal 212, is selectively applied to the input of the variable control signal generator 112 in response to the completed controlled change in power supply voltage indication signal 210. For instance, the completed controlled change in power supply voltage indication signal 210 may selectively open and close the switch logic 512, thereby selectively applying the stabilizing control signal 212 to variable clock signal generator 112.

In summary, the dynamic fast lock control signal generator 204 receives a generated clock signal 114 based on the process corner control signal 414 during a chip reset mode. By comparing the frequency of this generated clock signal 503 to at least one of a plurality of threshold frequencies stored in the frequency threshold memory 506, the process corner and stabilizing logic 504 determines the process corner of the integrated circuit. Using the determined process corner of the integrated circuit and the received desired power supply voltage 416, the process corner and stabilizing logic 504 generates a control signal 509 to set the resistance divider network 510, thereby generating the stabilizing control signal 212 for stabilizing the generated clock signal 114 of the power supply voltage ramping. The methods of FIGS. 8-13 described below may be implemented using the structure described in FIG. 4. However, one of ordinary skill in the art will appreciate that any other suitable structures may be utilized as desired. Therefore, any references to FIG. 4-7 are merely intended for the purpose of illustration and are not intended to be limiting.

Figure 8:
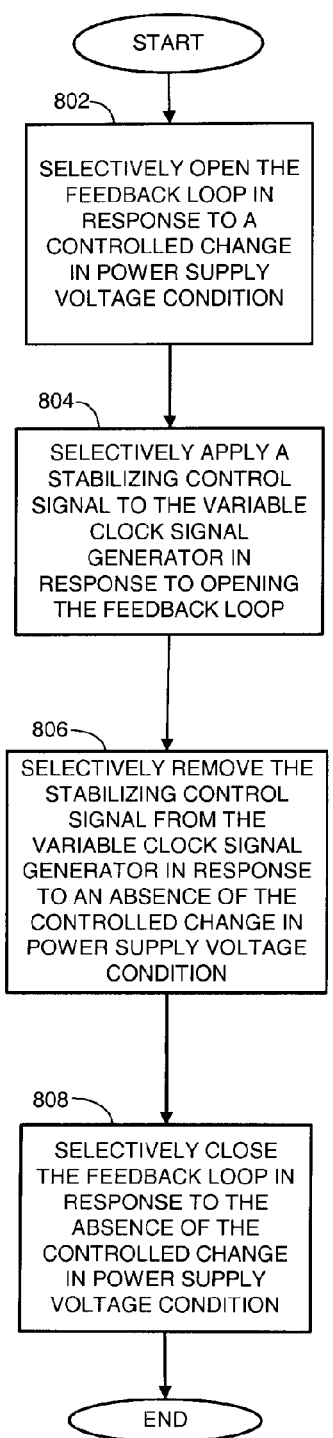
FIG. 8 is a flow chart illustrating an example of second method for generating a clock signal using a clock generating circuit located on an integrated circuit having a feedback loop and a variable clock signal generator.

FIG. 8 illustrates a method for generating a clock signal using a clock generating circuit located on an integrated circuit having a feedback loop and a variable clock signal generator. The method starts with block 802 wherein the feedback loop is selectively opened in response to a controlled change in power supply voltage condition. As an example, in FIG. 4, the selectively driven charge pump 402 may selectively open the feedback loop L in response to a controlled change in power supply voltage condition. The method continues with block 804 wherein a stabilizing control signal is selectively applied to the variable clock signal generator in response to opening the feedback loop, wherein the variable clock signal generator may comprise a voltage controlled oscillator (VCO). For instance, the dynamic fast lock control signal generator 204 of FIG. 4 is operative to selectively apply the stabilizing control signal 212 in response to the feedback loop L being selectively opened by the selectively driven charge pump 402.

The method proceeds with block 806, wherein the stabilizing control signal is selectively removed from the VCO in response to an absence of the controlled change in power supply voltage condition. An absence of the controlled change in power supply voltage condition may indicate, for example that the power supply voltage is no longer being ramped. With respect to FIG. 4, the dynamic fast lock control signal generator 204 is operative to selectively remove the stabilizing control signal 212 in response to the absence of the controlled change in power supply voltage condition.

Lastly, the method concludes with block 808, wherein the feedback loop is selectively closed in response to the absence of the controlled change in power supply voltage condition. As an example, the selectively driven charge pump 402 of FIG. 4 is operative to selectively close the feedback loop L in response to the absence of the controlled change in power supply voltage condition.

Figure 9:
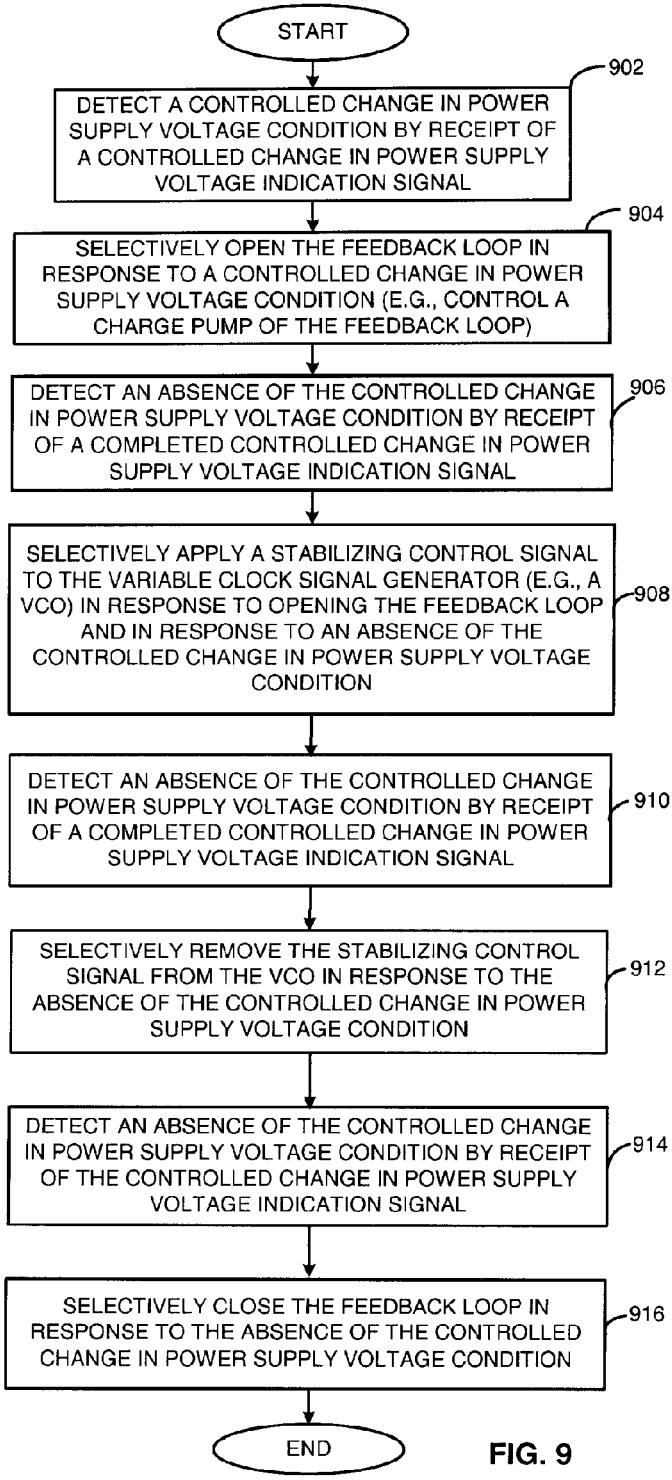
FIG. 9 is a flow chart illustrating an example of third method for generating a clock signal using a clock generating circuit located on an integrated circuit having a feedback loop and a variable clock signal generator.

The method of FIG. 9 illustrates another embodiment of generating a clock signal using a clock generating circuit located on an integrated circuit having a feedback loop and a variable clock signal generator. The method begins at block 902, wherein a controlled change in power supply voltage condition is detected by the receipt of a controlled change in power supply voltage indication signal. With respect to FIG. 4, the selectively driven charge pump 402, and more particularly the open feedback loop switch logic 202, is operative to receive, among other things, a controlled change in power supply voltage indication signal 208 and thereby detect a controlled change in power supply voltage condition. The method continues in block 904 wherein the feedback loop is selectively opened in the same manner described above in block 802 of FIG. 8. Notably, the method may include, additionally, controlling a change pump 208 of the feedback loop as described with reference to FIG. 4, thereby selectively opening the feedback loop L.

In block 906, the method continues by detecting an absence of the controlled change in power supply voltage condition by receipt of a completed controlled change in power supply voltage indication signal. For purposes of illustration, the dynamic fast lock control signal generator has an input operatively coupled to receive the completed controlled change in power supply voltage indication signal 210, which, upon receipt, indicates an absence of the controlled change in power supply voltage condition.

The method proceeds in block 908 such that a stabilizing control signal is selectively applied to the variable clock signal generator in response to opening the feedback loop and in response to an absence of a controlled change in power supply voltage condition. The stabilizing control signal may be, for example, a voltage such that the variable clock signal generator 112 produces the desired generated clock signal 114. As described above, this method may be performed by, among other suitable devices, the dynamic fast lock control signal generator 204 acting in response to the completed controlled change in power supply voltage indication signal 210.

Next, the method continues in block 910 wherein an absence of the controlled change in power supply voltage condition is detected by the receipt of the completed controlled change in power supply voltage indication signal. With reference to FIG. 4, this method may be carried out by, among other suitable devices, the dynamic fast lock control signal generator 204, which has an input operative to receive the completed controlled change in power supply voltage indication signal 210. The method proceeds in block 912, where the stabilizing control signal is selectively removed, in the same manner described above with respect to the method of block 806.

In block 914, an absence of the controlled change in power supply voltage condition is detected by receipt of the controlled change in power supply voltage indication signal. With respect to FIG. 4, this process may be carried out via the selectively driven charge pump 402 in response to the controlled change in power supply voltage indication signal 208. Lastly, the method concludes in block 916, where the feedback loop is selectively closed, in the same manner as described above with respect to block 808 of FIG. 8.

Figure 10:
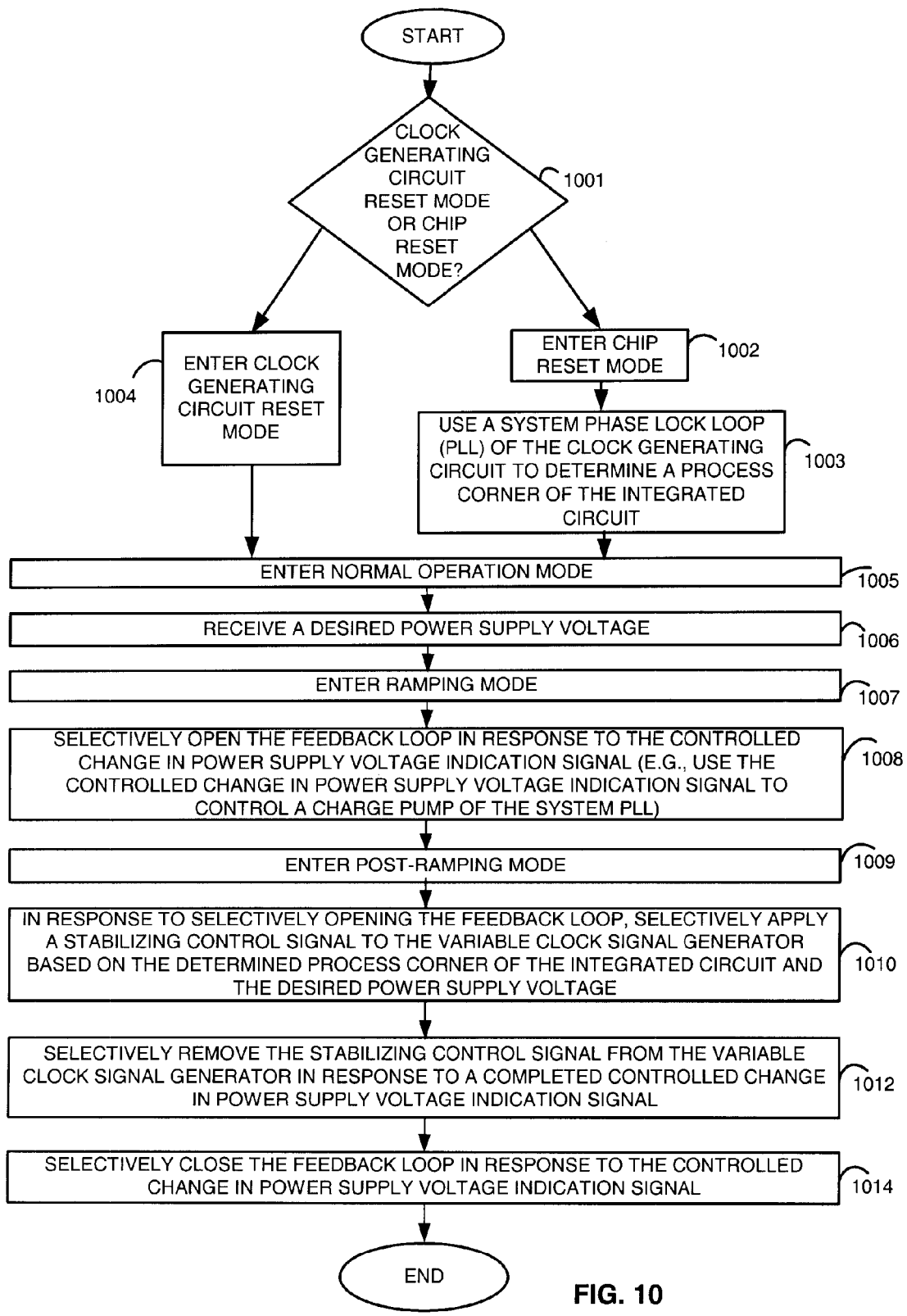
FIG. 10 is a flow chart illustrating an example of a fourth method for generating a clock signal and, in one mode, detecting a process corner of the integrated circuit during chip boot-up using a clock generating circuit located on an integrated circuit having a feedback loop and a variable clock signal generator.

FIGS. 10-12 and 14 illustrate a method and timing diagram for, among other things, generating a clock signal and, in one mode, detecting a process corner of the integrated circuit during chip boot-up using a clock generating circuit located on an integrated circuit having a feedback loop and a variable clock signal generator. The method begins as illustrated in FIG. 10, with decisional block 1001 wherein the clock generating circuit can enter either a clock generating circuit reset mode or chip reset mode. If a chip reset mode is entered, block 1002, the method continues in block 1003 where a system phase lock loop of the clock generating circuit is used to determine a process corner of the integrated circuit. Although not indicative of the sole manner of implementing the method described in block 1003, FIGS. 4-7, provide one example wherein a reset indication signal 412 and chip reset indication signal 418 are received and a dynamic fast lock control signal generator 204 is operative to receive a desired power supply voltage 416 and use a system phase lock loop of the clock generating circuit 400 to determine a process corner of the integrated circuit.

If however, clock generating circuit reset mode is selected at decisional block 1001, the method enters the clock generating circuit reset mode in block 1004. As explained, during clock generating circuit reset mode, the reset indication signal 412 might be applied to at least one of the loop filter 110, the selectively driven charge pump 402 and the phase frequency detector 102 to selectively open the feedback loop L and temporarily disable or initialize the clock generating circuit 400. After undergoing either clock generating circuit reset mode or, alternatively, chip reset mode, the method enters normal operation mode as illustrated in block 1005 where, for instance, the clock generating circuit is operative to receive a reference clock signal 102 and produce a generated clock signal 114. With reference to FIG. 14 and the plot labeled FREQUENCY OF THE GENERATED CLOCK SIGNAL, the clock generating circuit 400 locks the phase of the generated clock signal 114 to the phase of the reference clock signal 104 using feedback loop L during normal operation.

Next, a desired power supply voltage is received as shown by block 1006. After normal operation, a ramping mode is entered as illustrated in block 1007. During ramping, the power supply voltage of the clock generating circuit is dynamically ramped from a first voltage to a second voltage (i.e., the desired power supply voltage). Thereafter, the feedback loop is selectively opened in response to the controlled change in power supply of voltage indication signal as shown in block 1008. After ramping mode is complete, the clock generating circuit enters a post-ramping mode as illustrated in block 1009. The method proceeds to block 1010, wherein in response to selectively opening the feedback loop, a stabilizing control signal is selectively applied to the variable clock signal generator based on the determined process corner of the integrated circuit and the desired power supply voltage, wherein the variable clock signal generator is a voltage controlled oscillator. The method concludes wherein the stabilizing control signal is selectively removed from the VCO in response to a completed control change in power supply voltage indication signal as indicated in block 1012. Lastly, the feedback loop is selectively closed in block 1014 in response to the controlled change in power supply voltage indication signal.

Figure 11:
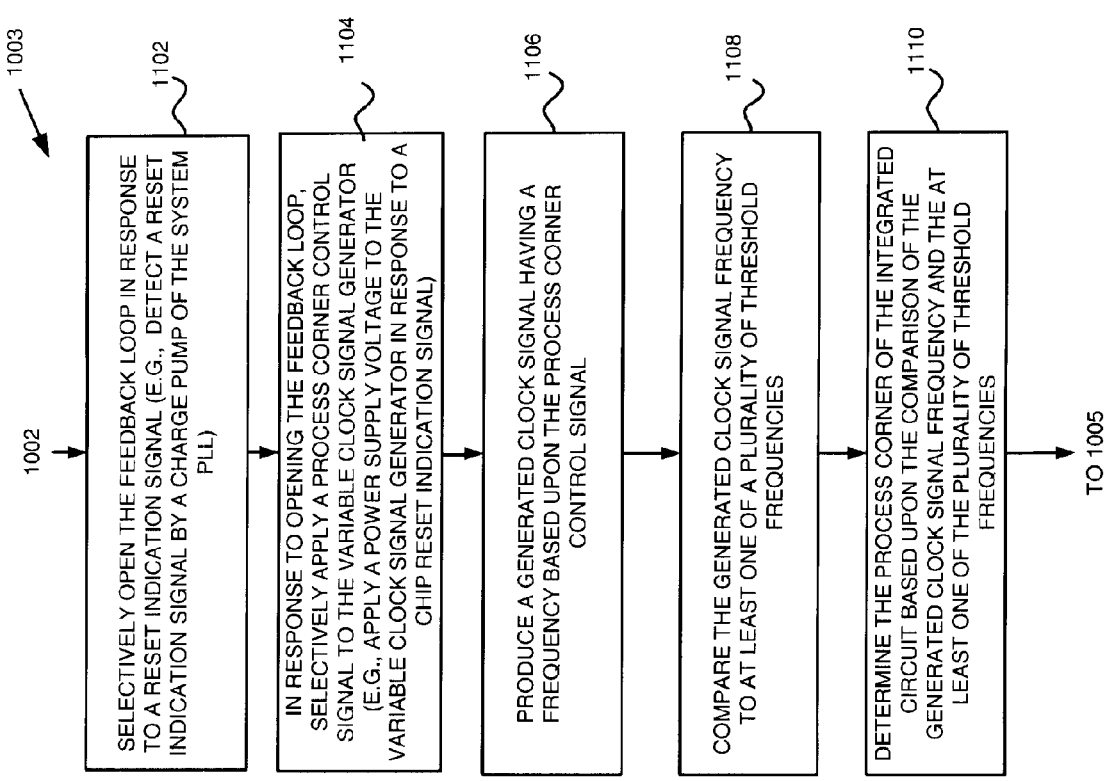
FIG. 11 is a flow chart illustrating an example of a method of using a system phase lock loop of a clock generating circuit located on an integrated circuit to determine a process corner of the integrated circuit as show in FIG. 10.

Turning to FIG. 11, a more detailed flowchart is provided illustrating, in one embodiment, the manner in which a system phase lock loop of a clock generating circuit can be utilized to determine a process corner of the integrated circuit as earlier described with respect to block 1003 of FIG. 10. After it is determined that a chip reset mode is desired as shown in block 1002, the feedback loop is selectively opened in response to a reset indication signal as illustrated in block 1102. In one embodiment, the reset indication signal might be received or detected by at least one of a phase frequency detector of the system PLL, a loop filter of the system PLL and a charge pump of the system PLL. In response to opening the feedback loop as described above in block 1102, the method proceeds wherein a process corner control signal is selectively applied to the VCO in block 1104. In one embodiment, this may correspond to applying a power supply voltage to the VCO in response to receiving a chip reset indication signal as illustrated by the plot PROCESS CORNER CONTROL INPUT in FIG. 14. Although not indicative of the sole manner of performing this method, FIG. 4 illustrates a process corner control signal generator 404 operatively coupled to receive the chip reset indication signal 418 and operative to produce a process corner control signal 414 based upon the chip reset indication signal 418. As described above, a chip reset indication signal 418 may selectively control a logic switch within the process corner control signal generator 404 such that the process corner control signal 414 represents a power supply voltage.

After selectively applying a process corner control signal, the method proceeds in block 1106 wherein a generated clock signal is produced having a frequency based upon the process corner control signal. FIG. 4 illustrates a variable clock signal generator 112 operative to produce a generated clock signal 114 based on one of many possible inputs. As described above, the process corner control signal 414, in one embodiment, is selectively provided as input to the variable clock signal generator 112 and as a result, the variable clock signal generator 112 is operative to produce a generated clock signal 114 having a frequency based upon a process corner control signal 414. Upon producing a generated clock signal having a frequency based upon the process corner control signal, the method proceeds in block 1108 wherein the generated clock signal frequency is compared to at least one of a plurality of threshold frequencies. Lastly, the method concludes in block 1110 wherein a process corner of the integrated circuit is determined based upon the comparison of the generated clock signal frequency and the at least one of the plurality of threshold frequencies. As described with respect to FIG. 5, the methods of blocks 1108 and 1110 may be, in one embodiment, implemented utilizing the process corner and stabilizing logic 504, the frequency threshold memory 506 and the frequency counter 502.

Figure 12:
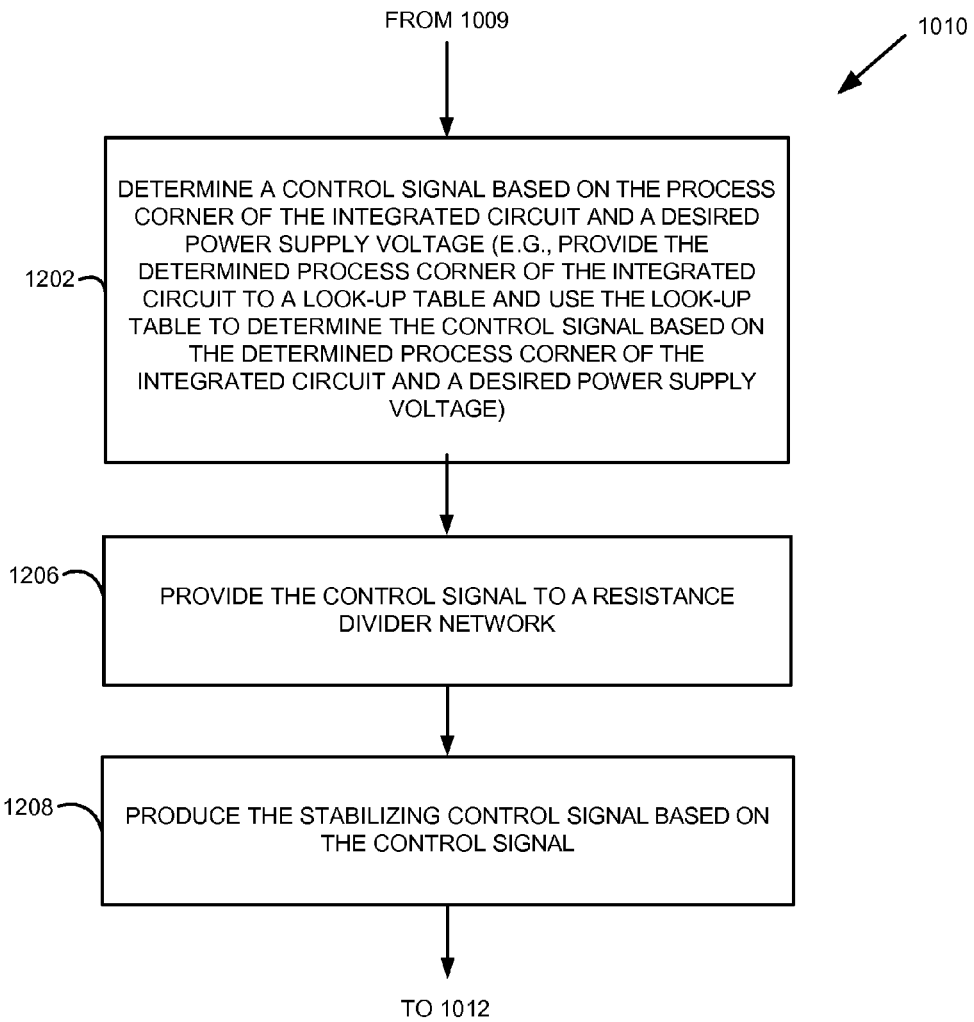
FIG. 12 is a flow chart illustrating an example of a method of, in response to selectively opening the feedback loop, selectively applying a stabilizing control signal to the variable clock signal generator based on the determined process corner of the integrated circuit and the desired power supply voltage of a clock generating circuit located on an integrated circuit having a feedback loop and a variable clock signal generator as show in FIG. 10.

Turning next to FIG. 12, a more detailed flowchart of the method described in block 1010 of FIG. 10 is illustrated. After selectively opening a feedback loop in response to the controlled change in power supply voltage indication signal and entering post-ramping mode as illustrated in blocks 1008 and 1009 of FIG. 10, the method begins at block 1202 wherein a control signal is determined based on the process corner of the integrated circuit and a desired power supply voltage. In one example, the control signal is determined by providing a determined process corner of the integrated circuit the desired power supply voltage to a look-up table and subsequently, using the look-up table to determine the control signal. After a desired control signal is determined, it is provided to a resistance divider network as illustrated in block 1206 and a stabilizing control signal is produced based upon the control signal provided to the resistance divider network as illustrated in block 1208. As described above, the look-up table 508, the process corner and stabilizing logic 504 and resistance divider network 510 as described with respect to the dynamic fast lock control signal generator 204 of FIGS. 5-7 may, in one embodiment, perform the methods described in FIG. 12.

The timing diagram of FIG. 14 may provide insight and one example of how the clock generating circuits of FIGS. 1, 2 and 4-7 operate. Although FIG. 14 illustrates one embodiment of various control signals and input signals, the method and apparatus described hereinabove should not be construed as limited to the specific signals illustrated.

Figure 13:
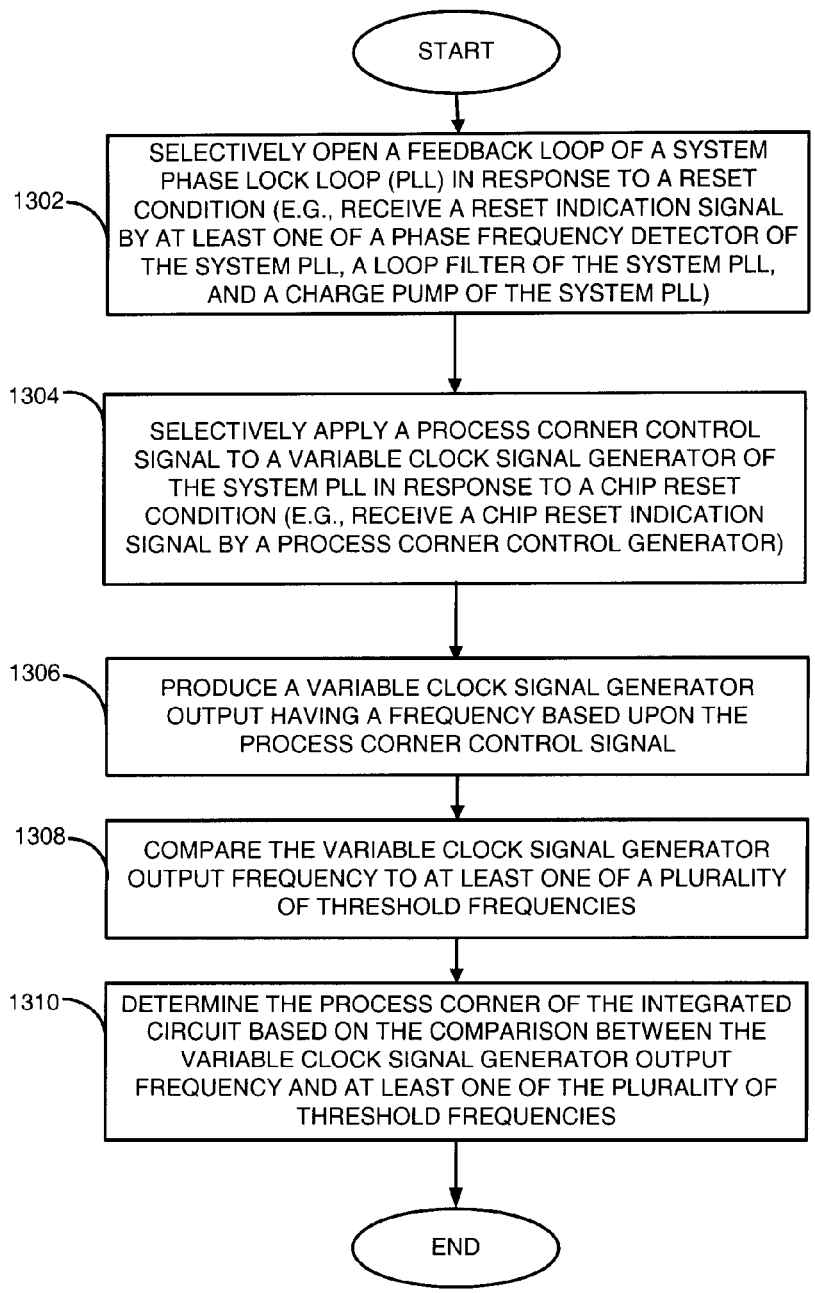
FIG. 13 is a flow chart illustrating an example of a method of determining a process corner of an integrated circuit in accordance with one embodiment the present invention.

In FIG. 13 a method for determining a process corner of an integrated circuit is described which may be done simply to determine a process corner of a chip or be used to provide fast locking of a clock generating circuit. The method begins with block 1302, wherein a feedback loop of a system phase lock loop is selectively opened in response to a reset condition. In one embodiment, this may correspond to receiving a reset indication signal by at least one of a phase frequency detector of the system PLL, a loop filter of the system PLL and a charge pump of the system PLL. Upon selectively opening a feedback loop of the system PLL, a process corner control signal is selectively applied in block 1304 to a variable clock signal generator of the system PLL in response to a chip reset condition. In one embodiment, this may correspond to receiving a chip reset indication signal. As a consequence, a variable clock signal generator output is produced in block 1306 wherein the output has a frequency based upon the process corner control signal. The method continues in block 1308 wherein the variable clock signal generator output frequency is compared to at least one of a plurality of threshold frequencies, and finally, in block 1310, the method concludes as the process corner of the integrated circuit is determined based upon the comparison between the variable clock signal generator output frequency and at least one of the plurality of threshold frequencies. The system PLL can therefore be used to determine the process corner of an integrated circuit and/or for further use in providing fast switching of a PLL Clock generating circuits 200 and 400 and the corresponding methods detailed in the figures described above, effectively allow for a fast locking time after power supply voltage ramping as a result of applying the stabilizing control signal 212 to the input of the variable clock signal generator 112 after ramping is complete. In other words, and as illustrated by the timing diagram of FIG. 14, the post-ramping frequency of the generated clock signal quickly locks onto a desired frequency, thereby providing the device with faster transition times among operational modes at new power supply voltage levels. The clock generating circuits 200 and 400 are able to produce a generated clock signal with fast locking times by minimizing feedback phase error detected by a phase frequency detector in the clock generating circuits. Other advantages will be recognized by those of ordinary skill in the art The above detailed description of the invention and the examples described therein have been presented for the purposes of illustration and description only and not by limitation. For example, a handheld device such as an e-mail device, audio player, video player or wireless cell phone may include an integrated circuit with clock generating circuits 200 or 400 operatively couple to a power supply voltage from a batter and operate as described above. Laptop computers, printers, cameras or any other suitable device may also include the circuits. It is therefore contemplated the present invention cover any and all modifications, variations, or equivalents that fall in the spirit and scope of the basic underlying principles disclosed above and claimed herein.

What is claimed is:

1. An integrated circuit having a clock generating circuit with a feedback loop and a variable clock signal generator comprising:
   open feedback loop switch logic responsive to a controlled change in power supply voltage indication signal, and operative to selectively open the feedback loop; and
   a dynamic fast lock control signal generator operative to selectively apply a stabilizing control signal to the variable clock signal generator in response to opening the feedback loop.

2. The integrated circuit of claim 1, wherein the dynamic fast lock control signal generator is responsive to a completed controlled change in power supply voltage indication signal and operative to selectively apply the stabilizing control signal to the variable control signal generator.

3. The integrated circuit of claim 1, wherein the dynamic fast lock control signal generator is responsive to a completed controlled change in power supply voltage indication signal and operative to selectively remove the stabilizing control signal from the variable control signal generator.

4. The integrated circuit of claim 1, wherein the open feedback loop switch logic is operative to selectively close the feedback loop in response to the controlled change in power supply voltage indication signal.

5. The integrated circuit of claim 1, wherein the dynamic fast lock control signal generator comprises:
   a frequency counter responsive to the generated clock signal and operative to determine the frequency of the generated clock signal;
   process corner and stabilizing logic responsive to the frequency of the generated clock signal and operative to determine the process corner of the integrated circuit and is further responsive to a desired power supply voltage and the determined process corner of the integrated circuit, and operative to produce a control signal; and
   a resistance divider network responsive to the control signal and operative to produce the stabilizing control signal.

6. An integrated circuit having a clock generating circuit with a feedback loop and a variable clock signal generator comprising:

open feedback loop switch logic responsive to a controlled change in power supply voltage indication signal, and operative to selectively open the feedback loop;

a dynamic fast lock control signal generator operative to selectively apply a stabilizing control signal to the variable clock signal generator in response to opening the feedback loop and is responsive to a completed controlled change in power supply voltage indication signal and operative to selectively remove the stabilizing control signal from the variable clock signal generator; and wherein the open feedback loop switch logic control input is operative to selectively close the feedback loop in response to the controlled change in power supply voltage indication signal.

7. The integrated circuit of claim 6, wherein the open feedback loop switch logic comprises at least one AND gate responsive to the controlled change in power supply voltage signal and operative to selectively control at least one switch of a charge pump, thereby selectively opening the feedback loop and closing the feedback loop, as desired.

8. The integrated circuit of claim 6, wherein the dynamic fast lock control signal generator control input is responsive to a completed controlled change in power supply voltage indication signal and operative to selectively apply the stabilizing control signal to the variable control signal generator.

9. An integrated circuit having a clock generating circuit with a feedback loop and a variable clock signal generator, the clock generating circuit comprising:

a system phase lock loop having:
  a phase frequency detector responsive to a reference clock signal and a feedback clock signal, and operative to produce a phase adjust signal;
  a selectively driven charge pump responsive to the phase adjust signal and a controlled change in power supply voltage indication signal, and operative to selectively open the feedback loop and selectively apply a charged control signal to the variable clock signal generator;
  wherein the variable clock signal generator is responsive to at least one of the charged control signal, a process corner control signal and a stabilizing control signal, and operative to produce a generated clock signal, wherein the feedback clock signal is based upon the generated clock signal;
  a process corner control signal generator responsive to a chip reset indication signal and operative to selectively apply the process corner control signal; and
  a dynamic fast lock control signal generator responsive to the generated clock signal and a completed controlled change in power supply voltage indication signal, and operative to selectively apply the stabilizing control signal to the input of the variable clock signal generator.

10. The integrated circuit of claim 9, wherein the selectively driven charge pump comprises:
  open feedback loop switch logic responsive to the phase adjust signal and the controlled change in power supply voltage indication signal, and operative to selectively open the feedback loop; and
  a charge pump responsive to the open feedback loop switch logic and operative to provide the charge control signal to the variable clock signal generator.

11. The integrated circuit of claim 10, wherein the charge pump is further responsive to a reset indication signal, and operative to open the feedback loop.

12. The integrated circuit of claim 9, wherein the clock generating circuit further comprises a loop filter responsive to the charged control signal and operative to generate a phase compensated control signal, and wherein the variable clock signal generator is further responsive to the phase compensated control signal.

13. The integrated circuit of claim 9, wherein the process corner control signal generator comprises a logic switch responsive to the chip reset indication signal and operative to selectively connect and disconnect the output of the process corner control generator to a power supply voltage.

14. The integrated circuit of claim 9, wherein the dynamic fast lock control signal generator is further responsive to a desired power supply voltage and wherein the dynamic supply voltage-based fast lock control signal generator comprises:
  a frequency counter responsive to the generated clock signal and operative to determine the frequency of the generated clock signal;
  process corner and stabilizing logic responsive to the frequency of the generated clock signal and operative to determine the process corner of the integrated circuit;
  wherein the process corner and stabilizing logic is further responsive to the desired power supply voltage and the process corner of the integrated circuit, and operative to produce a control signal; and
  a resistance divider network responsive to the control signal and operative to produce the stabilizing control signal.

15. The integrated circuit of claim 14, wherein the dynamic fast lock control signal generator further comprises:
  a frequency threshold memory operably coupled to the process corner and stabilizing logic;
  a look-up table operably coupled to the process corner and stabilizing logic;
  wherein the process corner and stabilizing logic is responsive to the frequency of the generated clock signal and operative to access the frequency threshold memory to determine the process corner of the integrated circuit based on a comparison between the frequency of the generated clock signal and at least one threshold frequency accessed in the frequency threshold memory; and
  wherein the process corner and stabilizing logic is responsive to the process corner and operative to access the look-up table to produce the control signal based upon the process corner and the desired power supply voltage.

16. An integrated circuit comprising:
  a process corner control signal generator responsive to a chip reset indication signal and operative to produce a process corner control signal;
  a system phase lock loop comprising a variable clock signal generator that receives in an input thereof, the process corner control signal and operative to produce a generated clock signal; and
  process corner logic responsive to the generated clock signal and operative to determine which of a plurality of process corners the integrated circuit is operating in based on the generated clock signal.

17. The integrated circuit of claim 16 further comprising:
a frequency counter responsive to the generated clock signal and operative to determine the frequency of the generated clock signal; and
wherein the process corner logic is responsive to the frequency of the generated clock signal and operative to access a frequency threshold memory to determine the process corner of the integrated circuit based on a comparison between the frequency of the generated clock signal and at least one threshold frequency accessed in the frequency threshold memory.

18. A method for generating a clock signal using a clock generating circuit located on an integrated circuit having a feedback loop and a variable clock signal generator, the method comprising:
selectively opening the feedback loop in response to a controlled change in power supply voltage condition; and
selectively applying a stabilizing control signal to the variable clock signal generator in response to opening the feedback loop.

19. The method of claim 18, wherein the method further comprises:
before selectively opening the feedback loop, determining the process corner of the integrated circuit; and
wherein selectively applying a stabilizing control signal comprises generating the stabilizing control signal based on the process corner of the integrated circuit.

20. A method for generating a clock signal using a clock generating circuit located on an integrated circuit having a feedback loop and a variable clock signal generator, the method comprising:
selectively opening the feedback loop in response to a controlled change in power supply voltage condition;
selectively applying a stabilizing control signal to the variable clock signal generator in response to opening the feedback loop;
selectively removing the stabilizing control signal from the variable clock signal generator in response to an absence of the controlled change in power supply voltage condition; and
selectively closing the feedback loop in response to the absence of the controlled change in power supply voltage condition.

21. The method of claim 20, wherein the controlled change in power supply voltage condition is detected by receipt of a controlled change in power supply voltage indication signal.

22. The method of claim 20, wherein selectively applying the stabilizing control signal to the variable clock signal generator in response to opening the feedback loop comprises selectively applying the stabilizing control signal to the variable clock signal generator in response to opening the feedback loop and in response to an absence of the controlled change in power supply voltage condition.

23. A method for generating a clock signal using a clock generating circuit located on an integrated circuit having a feedback loop and a variable clock signal generator, the method comprising:
using a system phase lock loop (PLL) of the clock generating circuit to determine a process corner of the integrated circuit;
receiving a desired power supply voltage;
selectively opening a feedback loop in response to a controlled change in power supply voltage indication signal;
in response to selectively opening the feedback loop, selectively applying a stabilizing control signal to the variable clock signal generator based on the determined process corner of the integrated circuit and the desired power supply voltage;
selectively removing the stabilizing control signal from the variable clock signal generator in response to a completed controlled change in power supply voltage indication signal; and
selectively closing the feedback loop in response to the controlled change in power supply voltage indication signal.

24. The method of claim 23, wherein using the system PLL to determine the process corner of the integrated circuit comprises:
selectively opening the feedback loop in response to a reset indication signal;
in response to opening the feedback loop, selectively applying a process corner control signal to the variable clock signal generator;
producing a generated clock signal having a frequency based on the process corner control signal;
comparing the generated clock signal frequency to at least one of a plurality of threshold frequencies; and
determining the process corner of the integrated circuit based on the comparison of the generated clock signal frequency and the at least one of the plurality of threshold frequencies.

25. The method of claim 24, wherein selectively applying a process corner control signal to the variable clock signal generator comprises applying a power supply voltage to the variable clock signal generator in response to a chip reset indication signal.

26. The method of claim 23, wherein selectively applying the stabilizing control signal to the variable clock signal generator comprises:
determining a control signal based on the process corner of the integrated circuit and a desired power supply voltage;
providing the control signal to a resistance divider network; and
producing the stabilizing control signal based on the control signal.

27. A method for determining a process corner of an integrated circuit comprising:
selectively opening a feedback loop of a system phase lock loop (PLL) in response to a chip reset condition;
selectively applying a process corner control signal to an input of a variable clock signal generator of the system PLL in response to a chip reset condition;
producing a variable clock signal generator output having a frequency based upon the process corner control signal;
comparing the variable clock signal generator output frequency to at least one of a plurality of threshold frequencies; and
determining the process corner based on the comparison between the variable clock signal generator output frequency and at least one of the plurality of threshold frequencies.

28. The method of claim 27, wherein selectively opening a feedback loop of the system PLL in response to the reset condition further comprises receiving a reset indication signal a charge pump of the system PLL.

29. The method of claim 27, wherein selectively applying a process corner control signal to the input of the variable clock signal generator of the system PLL in response to a chip reset condition further comprises receiving a chip reset indication signal.

30. A method for determining a process corner of an integrated circuit comprising:
   selectively opening a feedback loop of a system phase lock loop (PLL) in response to a chip reset condition;
   selectively applying a power supply voltage to an input of a variable clock signal generator of the system PLL in response to the chip reset condition;
   producing a variable clock signal generator output having a frequency based upon a process corner control signal;
   comparing the variable clock signal generator output frequency to at least one of a plurality of threshold frequencies; and
   determining the process corner based on the comparison between the variable clock signal generator output frequency and at least one of the plurality of threshold frequencies.

* * * * *